United States Patent [19]
Roth et al.

[11] Patent Number: 6,078,527
[45] Date of Patent: Jun. 20, 2000

[54] PIPELINED DUAL PORT INTEGRATED CIRCUIT MEMORY

[75] Inventors: Alan S. Roth; Scott George Nogle, both of Austin, Tex.

[73] Assignee: Motorola, Inc., Schaumburg, Ill.

[21] Appl. No.: 09/103,633

[22] Filed: Jun. 23, 1998

Related U.S. Application Data

[63] Continuation-in-part of application No. 08/902,009, Jul. 29, 1997, Pat. No. 5,781,480.

[51] Int. Cl.[7] ...................................................... G11C 7/00
[52] U.S. Cl. ................................ 365/189.04; 365/189.01; 365/189.05; 365/189.08; 365/230.08; 365/233
[58] Field of Search ......................... 365/189.01, 189.04, 365/189.05, 189.08, 230.08, 233

[56] References Cited

U.S. PATENT DOCUMENTS

| | | | |
|---|---|---|---|
| 4,918,664 | 4/1990 | Platt | 365/230.05 |
| 5,001,671 | 3/1991 | Koo et al. | 365/230.05 |
| 5,003,513 | 3/1991 | Porter et al. | 365/230.08 |
| 5,206,833 | 4/1993 | Lee | 365/233 |
| 5,440,717 | 8/1995 | Bosshart | 395/486 |
| 5,666,321 | 9/1997 | Schaefer | 365/233.5 |
| 5,781,480 | 7/1998 | Nogle et al. | 365/189.04 |
| 5,852,608 | 12/1998 | Csoppensky et al. | 365/230.03 |

OTHER PUBLICATIONS

Motorola, Inc., Motorola Semiconductor Technical Data, "Advance Information 64K x 18 Bit Synchronous Dual I/O, Dual Address SRAM", #MCM69D618/D, pp. 1–16.

Motorola Inc., Motorola Fast SRAM Data, "Fast Static RAM Component and Module Data", #MCM62110, pp. 4–10 –4–41.

Motorola Semiconductor Technical Data, "Advance Information 64K x 18 Bit Synchronous Separate I/O Fast SRAM", #MCM69Q618/D, 12 pages.

Quality Semiconductor, Inc., "QS70261A, QS7026A Preliminary, High–Speed CMOS 16K x 16 Asynchronous Dual–Port RAM", MDSF–00012–06, Jun. 6, 1996, pp. 1–22.

Integrated Device Technology, Inc., "High–Speed 32K x 16 Synchronous Pipelined Dual–Port Static Ram", Preliminary IDT709279S/L, Section 6.26, pp. 1–16 (1998).

*Primary Examiner*—Viet Q. Nguyen
*Attorney, Agent, or Firm*—Paul J. Polansky; Daniel D. Hill

[57] ABSTRACT

A pipelined dual port integrated circuit memory (20) includes an array (21) of static random access memory (SRAM) cells, wherein each of the memory cells (80) is connected to a single word line (72) and to a single bit line pair (74, 76). Each port's access is performed synchronously with respect to a corresponding clock signal. The two clock signal signals are asynchronous with respect to each other. When access requests are received from both ports substantially simultaneously, an arbitration circuit (24) determines which port receives priority. The port which receives priority accesses the array (21) first. The arbitration circuit (24) ensures that substantially simultaneous access requests are serviced sequentially and occur within a single cycle of a corresponding clock signal.

17 Claims, 3 Drawing Sheets

PIPELINED DUAL PORT INTEGRATED CIRCUIT MEMORY

This application is a continuation-in-part of prior application Ser. No. 08/902,009, filed Jul. 29, 1997 entitled "Pipelined Dual Port Integrated Circuit Memory," now U.S. Pat. No. 5,781,480 invented Scott George Nogle, Alan S. Roth, and Shuang Li Ho, and assigned to the assignee hereof.

FIELD OF THE INVENTION

This invention relates in general to memories, and more specifically to dual port memories.

BACKGROUND OF THE INVENTION

Dual port memories are useful for a wide variety of applications. They have special usefulness in the areas of communications and multiprocessor systems. In multiprocessor systems, one processor may write data into the array and the other processor may read data out. In particular, dual port RAMs are especially well suited for a communications application known as Asynchronous Transfer Mode (ATM). In an ATM switch, large amounts of data must be transferred between two processing devices. Another communications application is a standard IEEE 802.3 (commonly known under the trademark "Ethernet" available from Digital Equipment Corporation) communications router. These types of applications have a need for a dual port memory which is inexpensive but includes a large array.

Conventionally, dual port random access memories (RAMs) were constructed using one of two techniques. In the first technique, each memory cell was truly dual port and thus required eight transistors. Because the large dual port memory cells make the array itself quite large, integrated circuit memories based on this technique are expensive. A second technique utilizes standard single port static RAM cells with a partitioned array. If both ports simultaneously attempt to access the same partition, then one of the accesses must be delayed. As the number of partitions increases, the likelihood that a collision will occur decreases, but the cost increases due to the extra decoding and collision detection circuitry. Thus, what is needed is a lawe dual port RAM which uses conventional single port SRAM cells but which is also inexpensive and fast. These needs are met by the present invention whose features and advantages will be further described with reference to the drawings and the accompanying description.

DETAILED DESCRIPTION OF A PREFERRED EMBODIMENT

Figure 1:
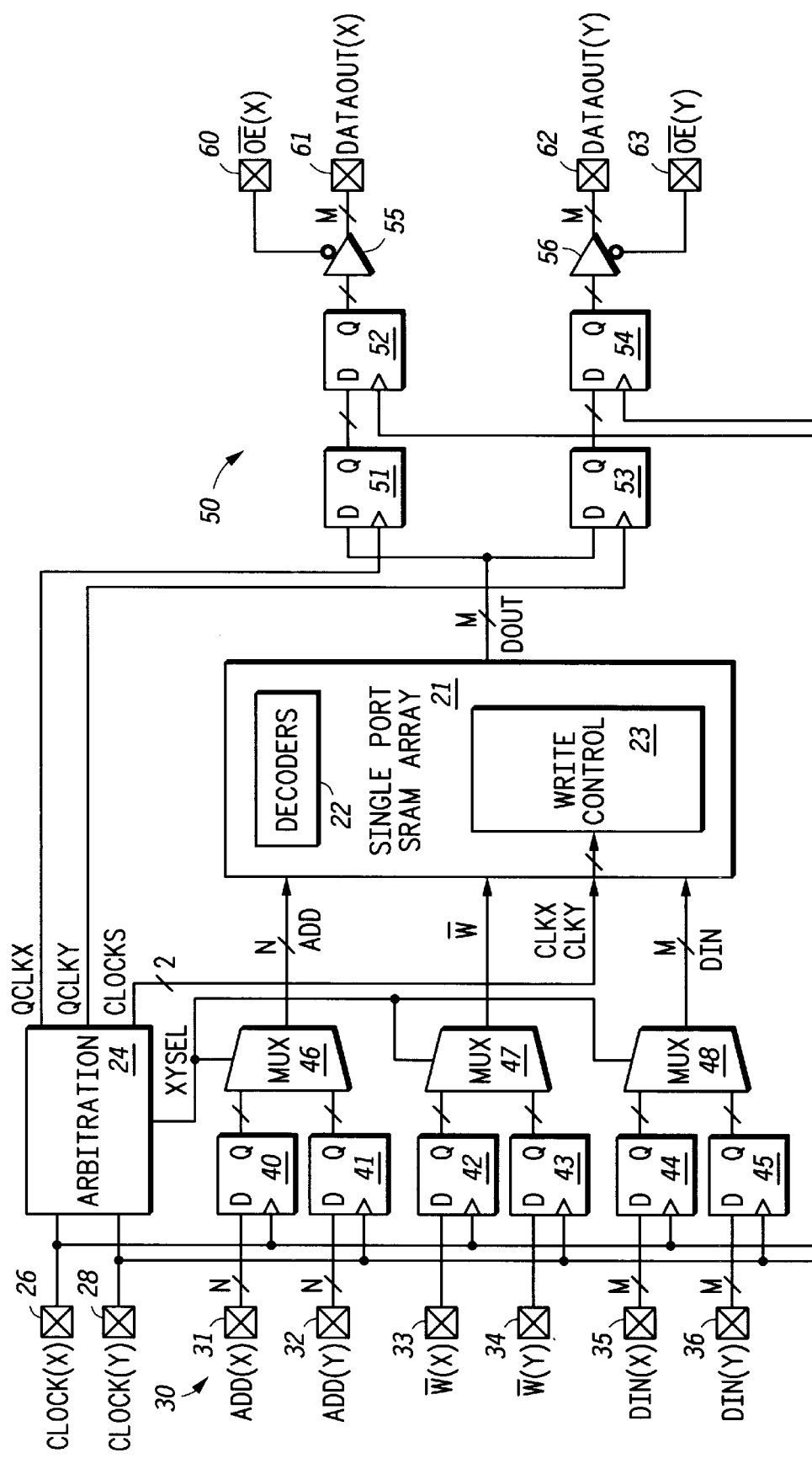
FIG. 1 illustrates in partial block diagram and partial logic diagram form a pipelined dual port integrated circuit memory according to the present invention.

FIG. 1 illustrates in partial block diagram and partial logic diagram form a memory 20 according to the present invention. Memory 20 is an integrated circuit dual-port static random access memory (SRAM) and includes generally a single port SRAM array 21, an arbitration circuit 24, bonding pads 26 and 28, an input portion 30, and an output portion 50. Array 21 has an input terminal for receiving an N-bit address, a control input terminal for receiving signal $\overline{W}$, clock input terminals for receiving clock signals labeled "CLKX" and "CLKY", a data input terminal for receiving an M-bit data value labeled "$D_{IN}$", and an output terminal for providing an N-bit data value labeled "$D_{OUT}$". Array 21 also includes a decoders block 22 and a rite control circuit 23.

Memory 20 is responsive to two clock signals labeled "CLOCK(X)" and "CLOCK(Y)" which are received respectively on bonding pads 26 and 28. Arbitration circuit 24 has a first input terminal connected to bonding pad 26 for receiving CLOCK(X), a second input terminal connected to bonding pad 28 for receiving CLOCK(Y), output terminals for providing signals CLKX and CLKY to array 21, an output terminal for providing a control signal labeled "XYSEL", an output terminal for providing a signal labeled "QCLKX", and an output terminal for providing a signal labeled "QCLKY".

Input portion 30 includes generally bonding pads 31–36, D-type flip-flops 40–45, and multiplexers (MUXes) 46–48. Bonding pad 31 receives an N-bit address signal labeled "ADD(X)". Bonding pad 32 receives an N-bit address signal labeled "ADD(Y)". Bonding pad 33 receives a write control signal labeled $\overline{W}$ (X). Bonding pad 34 receives a write control signal labeled $\overline{W}$ (Y). Bonding pad 35 receives an M-bit input data signal labeled "$D_{IN}(X)$". Bonding pad 36 receives an M-bit data input signal labeled "$D_{IN}(Y)$". As should be apparent, bonding pads 31 and 32 each represent N bonding pads for receiving respective address signals, and bonding pads 35 and 36 each represent M bonding pads for receiving respective $D_{IN}$ signals, but are illustrated in FIG. 1 as single bonding pads for clarity.

Flip-flop 40 has a D input terminal connected to bonding pad 31, a clock input terminal for receiving signal CLOCK (X), and a Q output terminal, and is representative of one of N D-type flip-flops receiving respective address signals of ADD(X) and providing respective latched address signals. Flip-flop 41 has a D input terminal connected to bonding pad 32, a clock input terminal for receiving signal CLOCK(Y), and a Q output terminal, and is representative of one of N flip-flops receiving respective address signals of ADD(Y) and providing latched address signals. Flip-flop 42 has a D input terminal connected to bonding pad 33, a clock input terminal for receiving signal CLOCK(X), and a Q output terminal. Flip-flop 43 has a D input terminal connected to bonding pad 34, a clock input terminal for receiving signal CLOCK(Y), and a Q output terminal. Flip-flop 44 has a D input terminal connected to bonding pad 35, a clock input terminal for receiving signal CLOCK(X), and a Q output terminal, and is representative of one of M flip-flops receiving respective ones of signal $D_{IN}(X)$. Flip-flop 45 has a D input terminal connected to bonding pad 36, a clock input terminal for receiving signal CLOCK(Y), and a Q output terminal, and is representative of one of M flip-flops receiving corresponding ones of signal $D_{IN}(Y)$.

MUX 46 has a first input terminal connected to the Q output terminal of flip-flop 40, a second input terminal connected to the Q output terminal of flip-flop 41, a control input terminal for receiving signal XYSEL, and an output terminal, and is representative of one of N MUXes receiving respective address signals of ADD(X) and ADD(Y), and providing corresponding outputs thereof as signal ADD to array 21. MUX 47 has a first input terminal connected to the Q output terminal of flip-flop 42, a second input terminal connected to the Q output terminal of flip-flop 43, a control input terminal for receiving signal XYSEL, and an output terminal for providing signal $\overline{W}$ to array 21. MUX 48 has a first input terminal connected to the Q output terminal of flip-flop 44, a second input terminal connected to the Q output terminal of flip-flop 45, a control input terminal for receiving signal XYSEL, and an output terminal for providing signal $D_{IN}$ to array 21, and is representative of one of M MUXes receiving respective ones of signals $D_{IN}(X)$ and $D_{IN}(Y)$, and providing corresponding outputs thereof as signal $D_{IN}$ to array 21.

Output portion 50 includes generally D type flip-flops 51–54, three-state buffers 55 and 56, and bonding pads 60–64. Flip-flop 51 has a D input terminal connected to the output terminal of array 21, a clock input terminal for receiving QCLKX, and an output terminal, and is representative of one of M flip-flops receiving respective ones of signal $D_{OUT}$, and providing corresponding outputs. Flip-flop 52 has a D input terminal connected to the Q output terminal of flip-flop 51, a clock input terminal for receiving signal CLOCK(X), and an output terminal, and is representative of one of M flip-flops, each corresponding to one of the prior flip-flops represented by flip-flop 51. Flip-flop 53 has a D input terminal connected to the D output terminal of array 21, a clock input terminal for receiving signal QCLKY, and an output terminal, and is representative of one of M flip-flops receiving respective ones of signal $D_{OUT}$, and providing corresponding outputs. Flip-flop 54 has a D input terminal connected to the Q output terminal of flip-flop 53, a clock input terminal for receiving signal CLOCK(Y), and an output terminal, and is representative of one of M flip-flops each corresponding to one of the prior flip-flops represented by flip-flop 53. Buffer 55 has a data input terminal connected to the Q output terminal of flip-flop 52, a data output terminal, and a control terminal connected to bonding pad 60, and is representative of one of M buffers connected to corresponding ones of flip-flops 52. Buffer 56 has a data input terminal connected to the Q output terminal of flip-flop 54, an output terminal, and a control input terminal connected to bonding pad 63, and is representative of one of M buffers corresponding to each of flip-flops 54. Bonding pad 60 receives an output enable signal labeled "$\overline{OE}$ (X)" which is connected to the control input terminal of buffer 55. Bonding pad 61 is connected to the output terminal of buffer 55 for providing an output signal labeled "$DATA_{OUT}(X)$", and is representative of one of M bonding pads corresponding to each buffer like buffer 55. Bonding pad 62 is connected to the output terminal of buffer 56 for providing a signal labeled "$DATA_{OUT}(Y)$" and is representative of one of M bonding pads connected to outputs of corresponding ones of buffer 56. Bonding pad 63 receives an output enable signal labeled "$\overline{OE}$ (Y)" and is connected to the control terminal of buffer 56.

In operation, memory 20 functions as a full dual port, static random access memory (SRAM). In memory 20, there are no circumstances in which an access cannot occur within a single cycle of its respective clock signal. In addition, memory 20 uses a standard 6-transistor SRAM cell and thus avoids the need for special dual ported cells associated with the other dual ported technique.

Memory 20 accomplishes these advantages by allowing accesses to array 21 to occur asynchronously over each port, wherein each access starts with a low-to-high transition of the respective clock signal. Thus, as long as signals CLOCK (X) and CLOCK(Y) have a frequency lower than a specified maximum frequency, memory 20 ensures that both accesses complete within a single one of their respective clock cycles. In particular, dual-port SRAM 20 uses arbitration circuit 24 to ensure that when CLOCK(X) and CLOCK(Y) have low-to-high transitions that occur nearly simultaneously, priority is given to the access on the X port. Furthermore, arbitration circuit 24 ensures that for very small amounts of skew between CLOCK(X) and CLOCK(Y), no metastability problems are encountered.

Array 21 is a single-port memory core capable of being accessed at twice the speed of either signal CLOCK(X) or CLOCK(Y). Generally, memory 20 generates requests for access to array 21 in response to external access requests. Arbitration circuit 24 ensures that the earlier of the two access requests is presented to array 21, except in the case when two access requests are received substantially simultaneously. In this case, arbitration circuit 24 awards priority to the X port.

More particularly, arbitration circuit 24 outputs signal XYSEL to indicate whether the X port or the Y port has been given access to array 21. In this particular embodiment, a logic high level represents an access on the X port whereas a logic low level represents an access on the Y port. Thus if signal XYSEL is a logic high, MUX 46 selects the first input thereof and presents signal ADD(X) as the N-bit signal ADD to array 21. Array 21 then performs conventional row and column decoding using decoders 22 to provide signal $D_{OUT}$ (assuming the access is a read cycle). Similarly, if arbitration circuit 24 provides signal XYSEL at a logic low, MUX 46 selects the second input thereof. Signal XYSEL selects inputs of MUXes 47 and 48 corresponding to the port which arbitration circuit 24 has given priority to. In addition, arbitration circuit 24 provides clock signal CLKX and CLKY to write control circuit 23 of array 21. Note in that in other embodiments, clock signals CLKX and CLKY may be replaced by a single clock signal.

Signals QCLKX and QCLKY control the read data path of the X and Y ports respectively. Signal QCKLX is input to the clock input terminal of flip-flops 51 and signal QCLKY is input to the clock input terminal of flip-flops 53. Note that data output path also includes additional flip-flops 52 and 54 to synchronize the incoming data with the next rising edge of signals CLOCK(X) and CLOCK(Y) respectively. Buffers 55 and 56 provide conventional three state control for signals $DATA_{OUT}(X)$ and $DATA_{OUT}(Y)$.

Figure 2:
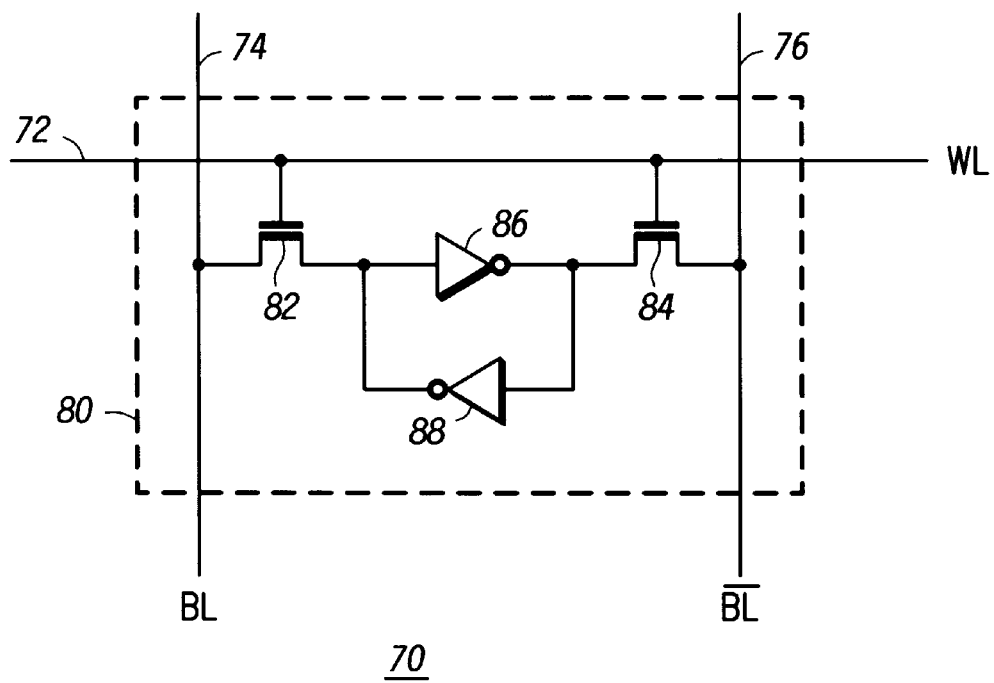
FIG. 2 illustrates in partial schematic and partial block diagram form a portion of the array of FIG. 1 including a single port static RAM cell.

FIG. 2 illustrates in partial schematic and partial block diagram form a portion 70 of array 21 of FIG. 1 including a single port memory cell 80. Memory cell 80 is a static RAM cell accessed by the activation of a signal labelled "WL" conducted on a word line 72 and conducts a differential data signal labelled "BL" and "$\overline{BL}$" on a complementary pair of bit lines 74 and 76, respectively. Memory cell 80 includes N-channel metal oxide semiconductor (MOS) transistors 82 and 84, and inverters 86 and 88. Transistor 82 has a first current electrode connected to bit line 74, a gate connected to word line 72, and a second current electrode. Transistor 84 has a first current electrode connected to bit line 76, a gate connected to word line 72, and a second current electrode. Inverter 86 has an input terminal connected to the second current electrode of transistor 82, and an output terminal connected to the second current electrode of transistor 84. Inverter 88 has an input terminal connected to the output terminal of inverter 86, and an output terminal connected to the input terminal of inverter 86.

In operation, memory cell 80 is a standard single port six-transistor memory cell whose logic state is stored due to the operation of back-to-back inverters 86 and 88. Note that as described herein, the number of transistors in a memory cell includes the access transistors in addition to the transistors that perform the storage. Memory cell 80 is conventionally accessed by the activation of word line 72. When word line 72 is active, transistors 82 and 84 become conductive, coupling the contents of the memory cell as a relatively small differential voltage onto bit lines 74 and 76. This voltage is subsequently sensed and output. During a write cycle, external circuitry provides a relatively large differential voltage between BL and $\overline{BL}$ to over-write the contents stored in memory cell 80.

Memory cell 80 differs from a standard eight transistor dual ported memory cell. First, it only includes six instead of eight transistors. Second, it only is connected to a single complementary pair of bit lines instead of two separate pairs of bit lines, saving two additional access transistors. Furthermore, there is only a single word line which is able to access memory cell 80, as compared with two word lines for the dual ported memory cell. In addition to saving two transistors, the connection to only a single word line and a single bit line pair also reduces the amount of metal wiring into and out of memory cell 80. These effects allow array 21 to be constructed using relatively cheap conventional SRAM cells. Note that an array constructed using single port memory cells like memory cell 80 will be about 25% of the size of an array based on a corresponding eight-transistor true dual port memory cell.

Figure 3:
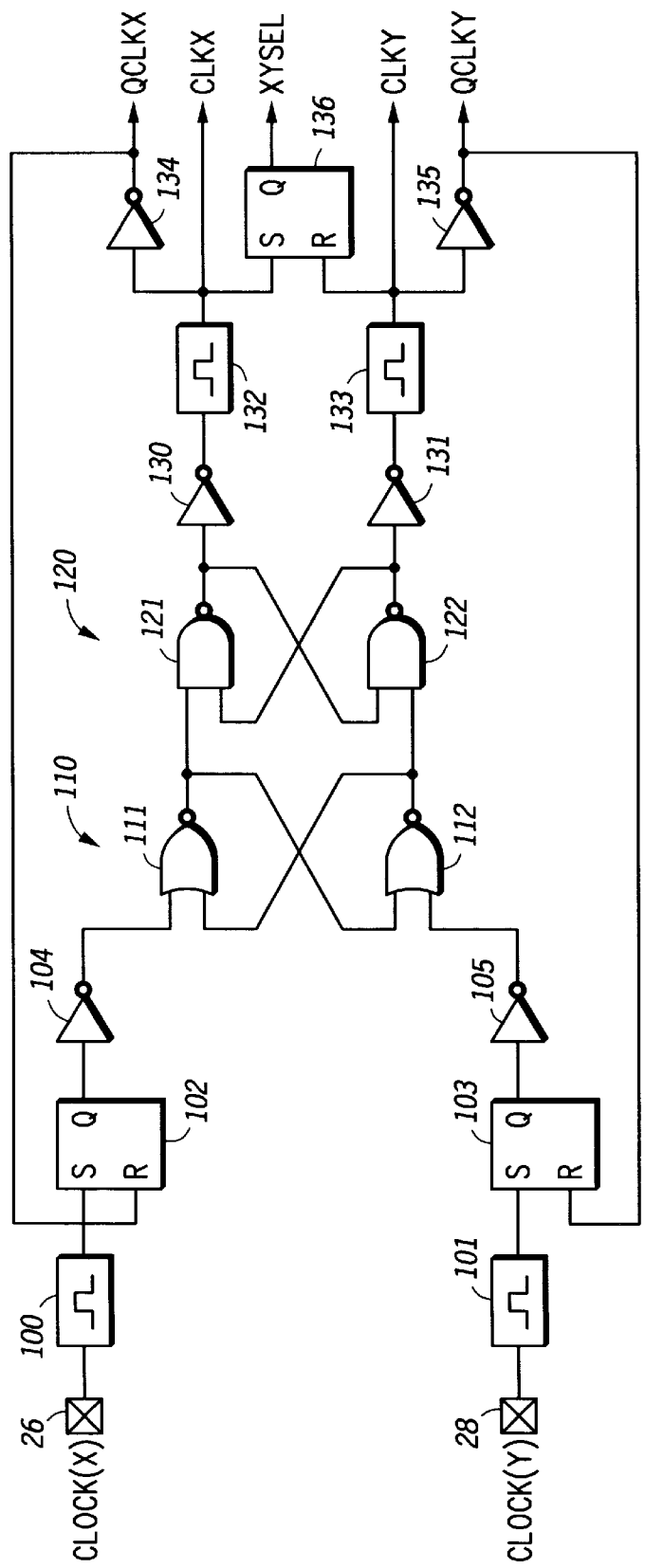
FIG. 3 illustrates in partial block diagram and partial logic diagram form the arbitration circuit of FIG. 1.

FIG. 3 illustrates in partial block and partial logic diagram form arbitration circuit 24 of FIG. 1. Arbitration circuit 24 includes one shots 100 and 101, SR flip-flops 102 and 103, inverters 104 and 105, a NOR latch 110, a NAND latch 120, inverters 130 and 131, one shots 132 and 133, inverters 134 and 135, and an SR flip-flop 136. One shot 100 has an input terminal connected to bonding pad 26 for receiving signal CLOCK(X), and an output terminal. One shot 101 has in input terminal connected to bonding pad 28 for receiving signal CLOCK(Y), and an output terminal. Flip-flop 102 has an S input terminal connected to the output terminal of one shot 100, an R input terminal, and a Q output terminal. Flip-flop 103 has an S input terminal connected to the output terminal of one shot 101, an R input terminal, and a Q output terminal. Inverter 104 has an input terminal connected to the Q output terminal of flip-flop 102, and an output terminal. Inverter 105 has an input terminal connected to the Q output terminal of flip-flop 103 and an output terminal.

Nor latch 110 includes NOR gates 111 and 112. NOR gate 111 has a first input terminal connected to the output terminal of inverter 104, a second input terminal, and an output terminal. NOR gate 112 has a first input terminal connected to the output terminal of NOR gate 111, a second input terminal connected to the output terminal of inverter 105, and an output terminal connected to the second input terminal of NOR gate 111.

NAND latch 120 includes NAND gates 121 and 122. NAND gate 121 has a first input terminal connected to the output terminal of NOR gate 111, a second input terminal, and an output terminal. NAND gate 122 has a first input terminal connected to output terminal of NAND gate 121, a second input terminal connected to the output terminal of NOR gate 112, and an output terminal connected to the second input terminal of NAND gate 121. Inverter 130 has an input terminal connected to the output terminal of NAND gate 121, and an output terminal. Inverter 131 has an input terminal connected to the output terminal of NAND gate 122, and an output terminal. One shot 132 has an input terminal connected to the output terminal of inverter 130, and an output terminal for providing signal CLKX. One shot 133 has an input terminal connected to the output terminal of inverter 131, and an output terminal providing signal CLKY. Inverter 134 has an input terminal connected to the output terminal of one shot 132 and output terminal connected to the R input terminal of flip-flop 102 for providing signal QCLKX. Inverter 135 has an input terminal connected to the output terminal of one shot 133, and an output terminal connected to the R input terminal of flip-flop 103 for providing signal QCLKY. Flip-flop 136 has an S input terminal connected to the output terminal of one shot 132, an R input terminal connected to the output terminal of one shot 133, and a Q output terminal for providing signal XYSEL.

Arbitration circuit 24 includes two one shots 100 and 101 to provide short duration pulses to resolve noisy transitions in signal CLOCK(X) and CLOCK(Y). The pulse widths of one shots 100 and 101 are short enough so that when CLOCK(X) or CLOCK(Y) have a relatively low frequency, the reset inputs to flip-flops 102 and 103 will not occur before the set inputs are invalid. The Q outputs of flip-flops 102 and 103 are inverted and provided to inputs of NOR latch 110.

Note that under certain conditions NOR latch 110 can become metastable. In these conditions, the outputs of NOR gates 111 and 112 tend to remain stuck at an intermediate level. Arbitration circuit 24 resolves this metastability condition, however, through NAND latch 120. The threshold of NAND latch 120 is set such that if NOR latch 110 becomes metastable, NAND latch 120 will still resolve. The outputs of NAND latch 120 are further inverted and input to one shots 132 and 133. One shots 132 and 133 convert what may be slow or unstable clock signals and generate sharp pulses having a limited duration in response. The outputs of one shots 132 and 133 are inverted to provide signals QCLKX and QCLKY, which are fed back to the R inputs of flip-flops 102 and 103. This feedback action resolves any metastability in NOR latch 110.

Although the present invention has been described with reference to a specific embodiment, further modifications and improvements will occur to those skilled in the art. Therefore it is to be understood that the invention encompasses all such modifications that do not depart from the scope of the invention as defined in the appended claims.

What is claimed is:

1. An integrated circuit memory, comprising:

a plurality of memory cells, each of the plurality of memory cells being coupled to a single word line and to a single bit line pair;

an address decoder, coupled to the plurality of memory cells, for selecting a memory cell of the plurality of memory cells in response to receiving an address;

a first address port, coupled to the address decoder, for providing a first address to the address decoder for accessing the plurality of memory cells;

a second address port, coupled to the address decoder, for providing a second address to the address decoder for accessing the plurality of memory cells;

a read data port, coupled to the plurality of memory cells, for reading data from the plurality of memory cells in response to either the first or the second address;

a write data port, coupled to the plurality of memory cells, for writing data to the plurality of memory cells in response to either the first or the second address; and an arbitration circuit, coupled to the first and second address ports, for receiving a first clock signal and a second clock signal, the first and second clock signals being asynchronous to each other, the arbitration circuit determining which of the first or second addresses are provided to the plurality of memory cells during an access of the integrated circuit memory.

2. The integrated circuit memory of claim 1, wherein the integrated circuit memory is pipelined.

3. The integrated circuit memory of claim 1, wherein the arbitration circuit insures that substantially simultaneous requests are serviced sequentially within a single clock cycle of a predetermined one of the first or second clock signals.

4. The integrated circuit memory of claim 1, wherein the arbitration circuit provides a select signal for selecting which of the first or second addresses are provided to the plurality of memory cells in response to determining which of the first or second clock signals transitions first.

5. The integrated circuit memory of claim 4, wherein the arbitration circuit comprises:
   a first flip-flop having a first input terminal for receiving the first clock signal, and an output terminal for providing a first latched clock signal;
   a second flip-flop having a first input terminal for receiving the second clock signal, and an output terminal for a providing a second latched clock signal;
   a first pair of cross-coupled logic gates having first and second input terminals coupled to the output terminals of the first and second flip-flops, respectively, and having first and second output terminals;
   a second pair of cross-coupled logic gates, the second pair of cross-coupled logic gates having first and second input terminals coupled to the first and second output terminals of the first pair of cross-coupled logic gates, a first output terminal, and a second output terminal; and
   a third flip-flop having a first input terminal coupled to the first output terminal of the second pair of cross-coupled logic gates, a second input terminal coupled to the second output terminal of the second pair of cross-coupled logic gates, and an output terminal for providing the select signal.

6. The integrated circuit memory of claim 5, wherein the arbitration circuit further comprises:
   a first pulse generator having an input terminal coupled to the first output terminal of the second pair of cross-coupled logic gates, and an output terminal coupled to the first input terminal of the third flip-flop; and
   a second pulse generator having an input terminal coupled to the second output terminal of the second pair of cross-coupled logic gates, and an output terminal coupled to the second input terminal of the third flip-flop.

7. The integrated circuit memory of claim 6, wherein the first flip-flop having a second input terminal coupled to the output terminal of the first pulse generator, and the second flip-flop having a second input terminal coupled to the output terminal of the second pulse generator.

8. The integrated circuit memory of claim 1, wherein the first and second clock signals are provided to the address decoder, the read data port, and the write data port, wherein in response to the arbitration circuit determining that the first clock signal transitioned first, the plurality of memory cells being accessed using the first clock signal for access timing, and in response to the arbitration circuit determining that the second clock signal transitioned first, the plurality of memory cells being accessed using the second clock signal for access timing.

9. A pipelined dual port static random access memory, comprising:
   a plurality of static random access memory cells, each of the plurality of static random access memory cells being coupled to a single word line and to a single bit line pair;
   an arbitration circuit for receiving a first clock signal and a second clock signal, the first and second clock signals being asynchronous to each other, the arbitration circuit for determining which of the first and second clock signals transitions first, and in response, providing a select signal;
   an address decoder, coupled to the plurality of static random access memory cells, for selecting a memory cell of the plurality of static random access memory cells in response to receiving an address;
   a first address port, coupled to the address decoder, for providing a first address to the address decoder for accessing the plurality of static random access memory cells in response to the select signal being at a first logic state;
   a second address port, coupled to the address decoder, for providing a second address to the address decoder for accessing the plurality of static random access memory cells in response to the select signal being at a second logic state;
   a first data port, coupled to the plurality of static random access memory cells, for reading data from, or writing data to, the plurality of static random access memory cells in response to receiving the first address, wherein the first data port is clocked using the first clock signal; and
   a second data port, coupled to the plurality of static random access memory cells for reading data from, or writing data to, the plurality of static random access memory cells in response to the second address, wherein the second data port is clocked using the second clock signal.

10. The pipelined dual port static random access memory of claim 9, wherein the arbitration circuit insures that substantially simultaneous requests for access are serviced sequentially within a single clock cycle of a predetermined one of the first or second clock signals.

11. The pipelined dual port static random access memory of claim 9, wherein the arbitration circuit comprises:
   a first flip-flop having a first input terminal for receiving the first clock signal, and an output terminal for providing a first latched clock signal;
   a second flip-flop having a first input terminal for receiving the second clock signal, and an output terminal for a providing a second latched clock signal;
   a first pair of cross-coupled logic gates having first and second input terminals coupled to the output terminals of the first and second flip-flops, respectively, and having first and second output terminals;
   a second pair of cross-coupled logic gates, the second pair of cross-coupled logic gates having first and second input terminals coupled to the first and second output terminals of the first pair of cross-coupled logic gates, a first output terminal, and a second output terminal;
   a third flip-flop having a first input terminal coupled to the first output terminal of the second pair of cross-coupled logic gates, a second input terminal coupled to the second output terminal of the second pair of cross-coupled logic gates, and an output terminal for providing the select signal.

12. The pipelined dual port static random access memory of claim 11, wherein the arbitration circuit further comprises:
   a first pulse generator having an input terminal coupled to the first output terminal of the second pair of cross-coupled logic gates, and an output terminal coupled to both the first input terminal of the third flip-flop and to a second input terminal of the first flip-flop; and a second pulse generator having an input terminal coupled to the second output terminal of the second pair of cross-coupled logic gates, and an output terminal coupled to both the second input terminal of the third flip-flop and to a second input terminal of the second flip-flop.

13. The pipelined dual port static random access memory of claim 11, wherein the first pair of cross-coupled logic gates are characterized as being logic gates for implementing a NOR logic function, and the second pair of cross-coupled logic gates are characterized as being logic gates for implementing a NAND logic function.

14. A pipelined dual port static random access memory, comprising:

a plurality of static random access memory cells, each of the plurality of static random access memory cells being coupled to a single word line and to a single bit line pair;

a first data port, coupled to the plurality of static random access memory cells, for reading data from, or writing data to, the plurality of static random access memory cells in response to receiving an address;

a second data port, coupled to the plurality of static random access memory cells for reading data from, or writing data to, the plurality of static random access memory cells in response to receiving an address; and an arbitration circuit, coupled to the first and second data ports, the arbitration circuit receiving a first clock signal and a second clock signal, wherein the first and second clock signals are asynchronous to each other, the arbitration circuit for determining which of the first or second clock signals is first to transition from a first logic state to a second logic state during an access of plurality of static random access memory cells;

wherein the first data port is clocked using the first clock signal; and wherein the second data port is clocked using the second clock signal.

15. The pipelined dual port static random access memory of claim 14, wherein the arbitration circuit insures that substantially simultaneous requests for access are serviced sequentially within a single clock cycle of a predetermined one of the first or second clock signals.

16. The pipelined dual port static random access memory of claim 14, wherein the arbitration circuit comprises:

a first flip-flop having a first input terminal for receiving the first clock signal, and an output terminal for providing a first latched clock signal;

a second flip-flop having a first input terminal for receiving the second clock signal, and an output terminal for a providing a second latched clock signal;

a first pair of cross-coupled logic gates having first and second input terminals coupled to the output terminals of the first and second flip-flops, respectively, and having first and second output terminals;

a second pair of cross-coupled logic gates, the second pair of cross-coupled logic gates having first and second input terminals coupled to the first and second output terminals of the first pair of cross-coupled logic gates, a first output terminal, and a second output terminal;

a third flip-flop having a first input terminal coupled to the first output terminal of the second pair of cross-coupled logic gates, a second input terminal coupled to the second output terminal of the second pair of cross-coupled logic gates, and an output terminal for providing a select signal, the select signal for controlling which of the first or second data ports have access to the plurality of static random access memory cells.

17. The pipelined dual port static random access memory of claim 16 wherein the arbitration circuit further comprises:

a first pulse generator having an input terminal coupled to the first output terminal of the second pair of cross-coupled logic gates, and an output terminal coupled to both the first input terminal of the third flip-flop and to a second input terminal of the first flip-flop; and a second pulse generator having an input terminal coupled to the second output terminal of the second pair of cross-coupled logic gates, and an output terminal coupled to both the second input terminal of the third flip-flop and to a second input terminal of the second flip-flop.

* * * * *